United States Patent [19]
Corley et al.

[11] Patent Number: 5,256,578
[45] Date of Patent: Oct. 26, 1993

[54] INTEGRAL SEMICONDUCTOR WAFER MAP RECORDING

[75] Inventors: Dean Corley, Tempe; Hugh W. Littlebury, Chandler, both of Ariz.

[73] Assignee: Motorola, Inc., Schaumburg, Ill.

[21] Appl. No.: 812,344

[22] Filed: Dec. 23, 1991

[51] Int. Cl.⁵ .......................................... H01L 21/66
[52] U.S. Cl. ........................................ 437/8; 437/7; 324/158 R
[58] Field of Search ............... 437/8, 7; 324/158 R, 324/158 T; 364/481, 491

[56] References Cited

U.S. PATENT DOCUMENTS

| | | | |
|---|---|---|---|
| 4,829,014 | 5/1989 | Yerman | 437/8 |
| 4,855,253 | 8/1989 | Weber | 437/8 |
| 5,039,602 | 8/1991 | Merrill et al. | 437/8 |

FOREIGN PATENT DOCUMENTS

| | | | |
|---|---|---|---|
| 57-27042 | 2/1982 | Japan | 437/8 |
| 57-50443 | 3/1982 | Japan | 437/8 |
| 57-95644 | 6/1982 | Japan | 437/8 |
| 3-142945 | 6/1991 | Japan | 437/8 |

Primary Examiner—Brian E. Hearn
Assistant Examiner—Kevin M. Picardat
Attorney, Agent, or Firm—Joe E. Barbee

[57] ABSTRACT

A method for integral semiconductor wafer map recording which comprises a semiconductor wafer (11) having a plurality of individual die (12, 13) thereon. Testing each of the individual die (12). Summarizing the results of the testing in a wafer map. Recording the wafer map on the semiconductor wafer (11) by laser scribing a binary code (19) within inactive die (13).

8 Claims, 1 Drawing Sheet

INTEGRAL SEMICONDUCTOR WAFER MAP RECORDING

BACKGROUND OF THE INVENTION

The present invention relates, in general, to information storage, and more particularly to storage of semiconductor wafer map information.

Semiconductor devices are typically fabricated as a plurality of individual die on a single wafer. A single wafer may contain as many as ten thousand discrete transistors or diodes. During the manufacture of these devices each individual die is typically tested before separation from the wafer. This testing comprises visual and electrical tests designed to distinguish unusable die from good die. To facilitate separation of the good and bad die, the bad die are typically marked using a colored ink dot. A common refinement of this testing uses the test results to separate individual die into categories. For example, each different category may each have a specific voltage range, temperature range or speed range. Typically each category is then marked with a different color ink dot. After the wafer is diced into individual die, the desired die are selected based on the coding of the ink dot. Likewise a plurality of different types of device may be fabricated on a single wafer to be separated after dicing by means of the ink dot marking.

Marking the die with ink dots has definite shortcomings. The number of useable categories is limited by the number of easily distinguished ink colors available. The ink can chemically damage the die or the packaged device. The ink can smear or run from one die to another die or the dot can dry and fall off the die. Any of these produces incorrectly marked die and causes incorrect die to be selected. The solvents which must be used to remove the ink for cleaning equipment and from marked die are hazardous chemicals which are difficult to use and store. Handling of the inks themselves is messy and requires extra housekeeping effort as well as causing ink stains on equipment, personnel and their clothing. There has long been perceived a need to eliminate the wafer inking process from semiconductor manufacturing. As a result, many alternative methods of recording the results of the wafer test information without using ink have been developed.

One such recording method uses a computer to generate a wafer map in memory which shows the category assigned to each die on the wafer as a numerical value. This wafer map may then be printed on paper or transferred electronically to the final assembly location. This wafer map information is then used to select the desired die as before. This method eliminates the use of ink and associated solvents. However many errors are introduced during transfer of the wafer and the corresponding wafer map information. The wafer map may be swapped with the wafer map from a different wafer, the wafer map may be incorrectly oriented with the wafer, the wafer map damaged, or the wafer map may be lost entirely. Similarly the wafer itself may break and die selected from a plurality of partial wafers. Each of these partial wafers must be handled separately and requires a copy of the correct part of the wafer map. These problems are often aggravated since the location where testing is performed is often a great distance from the location where dicing, die selection and final assembly takes place. As a result detection of such errors and subsequent correction becomes extremely difficult.

Another method which addresses this problem is described in U.S. Pat. No. 4,510,673, entitled "Laser Written Chip Identification Method", issued Apr. 16, 1985 to A. J. Shils et al, assigned to International Business Machines Corp., and which is incorporated herein by reference. Shils' method uses a laser to mark the back of each die with a unique identifying code. This method is oriented to use of an inverted mounting of the die in which the back surface of the die is exposed. Once written in this way, the code is read manually using low power magnification. This code is then used to verify the selection of the correct die and placement of the die on a multi-chip substrate. This approach allows the identification code to be used throughout the life of the die for assembly, verification, system test, and defect analysis. However Shils' method still requires matching of an external database containing information about the die with the die itself. Since the entire area of the top surface of the die is used to fabricate active devices, Shils' method can only be used on the back of the die. The most commonly used die mounting method however supports the die by the back of the die rather than by raised areas on the active surface of the die as taught by Shils. Thus the unique code marked on the back of the die cannot be read without destroying the packaged device. Shils' method also cannot be used with the typical die selection and final assembly process since the handling equipment is designed to hold and support the die by the back, obscuring the code.

There is a need for a way to record the die selection information in such a way that the information cannot be separated from the wafer. The information must not be corrupted or lost even if the wafer itself is damaged. The method should allow for breakage of the wafer into smaller portions, and should not use chemical marking methods. The method should be compatible with automated assembly techniques and with typical die assembly methods.

SUMMARY OF THE INVENTION

Briefly stated, the present invention provides a method for integral semiconductor wafer map recording which comprises providing a semiconductor wafer having a plurality of individual die thereon, testing each of the individual die, summarizing the results of the testing in a wafer map, and recording the wafer map on the semiconductor wafer by laser scribing a binary code within inactive die area of the wafer.

DETAILED DESCRIPTION OF THE DRAWINGS

Figure 1:
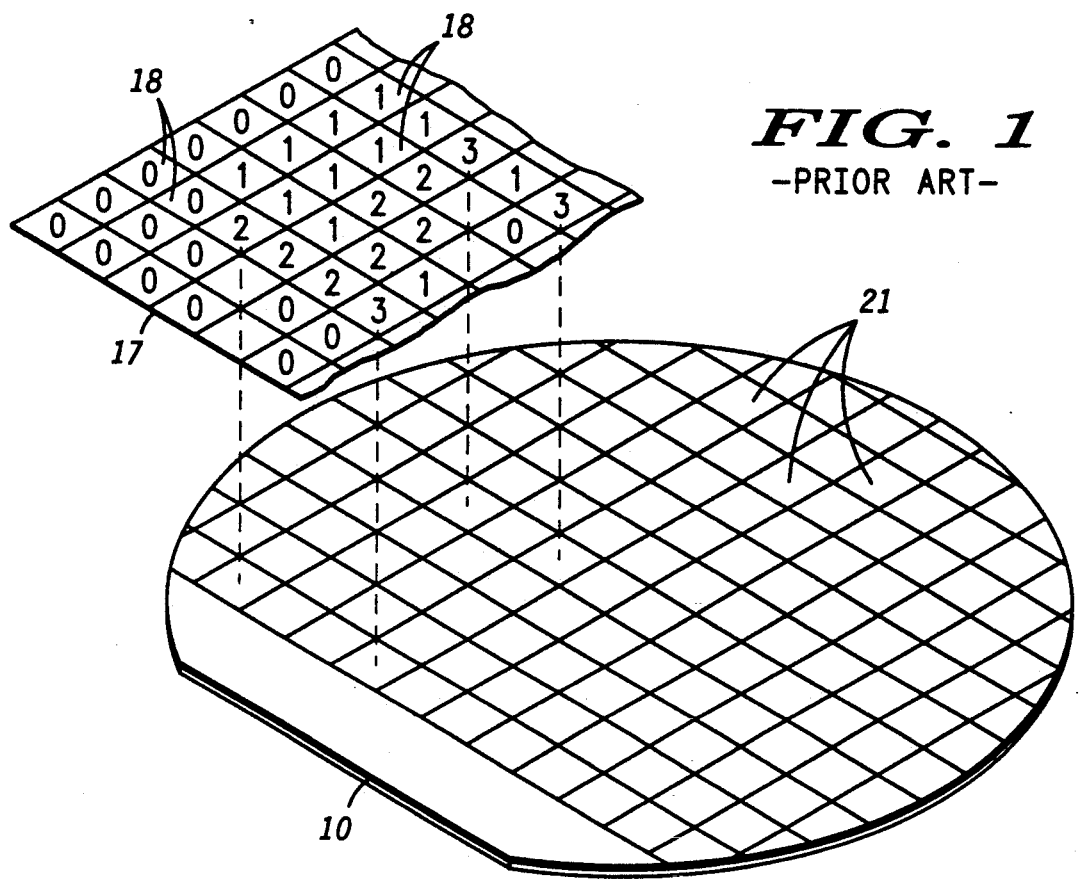
FIG. 1 shows a schematic representation of a segment of a wafer map superimposed on a semiconductor wafer according to the prior art.

FIG. 1 shows a schematic representation of a segment of a wafer map 17 superimposed on a semiconductor wafer 10 according to the prior art. Semiconductor wafer 10 has a plurality of die 21 which have been fabricated on an upper surface. Wafer map 17 comprises a plurality of numerical values 18 arranged in a two dimensional array. Each numerical value 18 corresponds to one specific die 21 on semiconductor wafer 10. The number assigned to each numerical value 18 indicates the category code for a corresponding die 21. In the example shown, a "0" represents those die 21 which do not function, a "1" represents die 21 which have been placed in a first category, a "2" represents die 21 which have been placed in a second category, and a "3" represents die 21 which have been placed in a third category. The selection of a correct category and associated numerical value 18 for each die 21 summarizes the results of testing of each die 21. Wafer map 17 thus facilitates selection of those die 21 which meet a predefined set of test criteria by selection of the desired category. This typically follows dicing and separation of the wafer into individual die 21.

Figure 2:
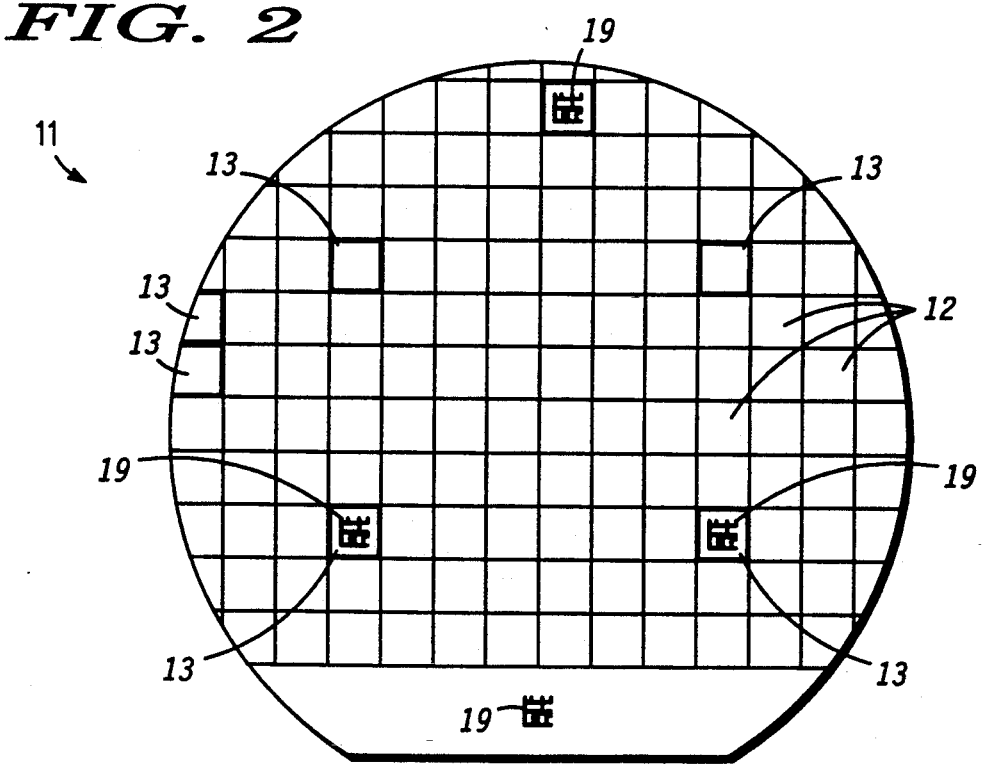
FIG. 2 shows a top view of a typical semiconductor wafer having information recorded in accordance with the present invention.

FIG. 2 shows a top view of semiconductor wafer 11 having information recorded in accordance with the present invention. A plurality of active die 12 and a plurality of inactive die 13 are fabricated on a surface of semiconductor wafer 11. Active die 12 comprise a plurality of areas within semiconductor wafer 11 on which electrically active devices are fabricated. Active die 12 comprise the portion of the wafer which is intended ultimately to be packaged as functioning devices. Active die 12 are typically tested for functionality before dicing of the wafer. Active die 12 can then be separated into a plurality of categories based on functional test results. The results of the testing and categorization are then summarized using a wafer map similar to wafer map 17 (FIG. 1).

In a preferred embodiment of the present invention, a binary code 19 is generated which contains the entire wafer map information. Binary code 19 is then recorded on semiconductor wafer 11 using laser scribing. In order to record the wafer map within the available area, the numerical information is compressed into a more compact form using one of the binary compression methods well known in the art. An alternative embodiment of the present invention additionally uses one of the data encryption methods well known in the art to ensure confidentiality of the manufacturing information contained within the wafer map. This embodiment of the invention encrypts the wafer map to produce an encrypted binary code. Compression of the encrypted information may be performed either before or after encryption. With either embodiment, the resultant binary information is formatted as binary code 19 and then recorded within inactive die 13. During the dicing, die selection and packaging of active die 21, binary code 19 is read by automatic means such as computer driven video equipment. Binary code 19 is then decompressed to produce the original wafer map. The wafer map is then used for manual selection of the desired active die 12 by creating a display based on the wafer map. Alternatively the wafer map may be used to control an automated wafer selection machine.

Inactive die 13, if tested, would all be categorized among those non-functioning die within category "0". Inactive die 13 typically comprise a plurality of process test patterns, a plurality of incomplete die, and a wafer handling area. Inactive die 13 are die which are designed so as not to be included in the final product and are typically scrapped after active die 12 are diced, selected and assembled into packages. Process test patterns comprise a plurality of areas having specialized electrical devices which are designed to allow testing and adjustment of the manufacturing process itself. Incomplete die comprise die which are formed on the periphery of semiconductor wafer 11 and which would be active die 12 except that part of the die extends beyond the edge of semiconductor wafer 11. Incomplete die result from the geometric constraints of fitting a plurality of square die onto a round wafer. Finally the wafer handling area typically comprises a flat edge of semiconductor wafer 11 which is used for orientation of the wafer and a small area used for handling of semiconductor wafer 11 during fabrication.

A preferred embodiment of the present invention uses a high powered laser to mark binary code 19 within predetermined inactive die 13. Since inactive die 13 are not used after fabrication of the wafer itself is completed, inactive die 13 may be used for recording of information without affecting the manufacturing and assembly of active die 12. Laser marking of semiconductor wafer 11, however, produces minute particles which must be removed. Since these particles are typically in the form of smoke they are readily removed while performing the laser marking with filtered air passing over the work area. Even so, laser marking produces less contamination than ink marking. In addition the particles produced from laser marking are not chemically harmful to semiconductor wafer 11 as are the chemicals used in the marking inks and related solvents.

It is speculated that an enhanced embodiment could use a low power laser coupled with a more sophisticated reading method such as surface holography to alleviate even this contamination problem. This enhanced embodiment would mark only a microscopic depth of the top surface by melting selected areas of the protective glass coating producing a series of fine depressions on the surface of semiconductor wafer 11. These fine depressions could then be detected using holographic effects. The resultant pattern could then be used to reconstruct binary code 19. This enhanced embodiment of the invention would potentially allow information to be recorded even on the surface of active die 12 without risking damage to the electrical devices underneath. Alternative embodiments utilize other areas of semiconductor wafer 11 for marking such as scribe channels, alignment keys or active die 12 which are found to be non-functional. Other embodiments of the present invention include marking binary code 19 on semiconductor wafer 11 scribing, photolithography or similar marking methods. Another embodiment replaces the plurality of categories with a simple code such as a "1" entry for active die 12 which pass the testing and a "0" entry for those active die 12 which fail the testing.

One suitable method for constructing binary code 19 is described in U.S. Pat. No. 4,939,354, entitled "Dynamically Variable Machine Readable Binary Code and Method for Reading and Producing Thereof", issued Jul. 3, 1990 to D. G. Priddy et al, assigned to Datacode International, Inc., and which is incorporated herein by reference. This patent describes a method for generating a binary code which is suited for writing onto an item by methods such as a laser. Once written, the binary code is easily read with commonly available video equipment and stored in a computer memory, facilitating use of automated equipment. According to the prior art, a binary code of this kind is typically used to mark an object with limited information such as a machine readable identification code.

A method suitable for compression of the wafer map information is described in U.S. Pat. No. 4,464,650, entitled "Apparatus and Method for Compressing Data Signals and Restoring the Compressed Data Signals", issued Jul. 8, 1984 to M. Cohn et al, assigned to Sperry Corporation, and which is incorporated herein by reference. This patent describes a method for significantly reducing the computer storage required of information such as the wafer map. In addition a method is described for restoring the original wafer map information from the compressed form.

The preferred embodiment of the present invention records a plurality of redundant copies of binary code 19 within a plurality of locations having inactive die 13 on semiconductor wafer 11. In the event that semiconductor wafer 11 is broken, a complete copy of binary code 19 will typically exist on each large fragment. Thus a complete wafer map and other information which is required to finish manufacturing will be available on each large fragment of semiconductor wafer 11. Similarly if part of semiconductor wafer 11 is damaged, for example by a scratch, the redundant copies of binary code 19 allow the remaining parts of semiconductor wafer 11 to be used.

By now it should be clear that the present invention provides a method for recording vital manufacturing information, such as the wafer map, which is an integral part of semiconductor wafer 11. Thus the manufacturing information cannot be separated from the wafer and is readily used by automated machinery using commonly available video and computer equipment. The manufacturing information will not be corrupted or lost unless the wafer itself is too badly damaged to be used. The invention allows for breakage of the wafer into smaller portions while still retaining the manufacturing information. The marking method used in the preferred embodiment does not use chemical inks so the marking cannot smear, run or drop off the surface. The method is compatible with automated assembly techniques and with non-inverted die assembly.

I claim:

1. A method for integral semiconductor wafer map recording, comprising:
   providing a semiconductor wafer;
   fabricating a plurality of active die and a plurality of inactive die on a surface of the semiconductor wafer;
   testing the active die;
   summarizing the results of the testing in a wafer map;
   compressing the wafer map to produce a binary code; and
   recording the binary code by laser scribing within at least one of the inactive die.

2. The method for integral semiconductor wafer map recording of claim 1 further comprising:
   categorizing each die based on the testing; and
   summarizing the results of the categorizing in the wafer map.

3. The method for integral semiconductor wafer map recording of claim 1 wherein the inactive die comprise a plurality of process test patterns.

4. The method for integral semiconductor wafer map recording of claim 1 wherein the inactive die comprise a plurality of incomplete die around the periphery of the semiconductor wafer.

5. The method for integral semiconductor wafer map recording of claim 1 further comprising:
   further recording a plurality of redundant copies of the binary code within a plurality of locations having inactive die.

6. The method for integral semiconductor wafer map recording of claim 1 further comprising:
   reading the binary code from the inactive die by mechanical means.

7. The method for integral semiconductor wafer map recording of claim 1 further comprising:
   encrypting the wafer map to produce an encrypted binary code; and
   recording the encrypted binary code by laser scribing within at least one of the inactive die.

8. A method for integral semiconductor wafer map recording, comprising:
   providing a semiconductor wafer;
   fabricating a plurality of active die on the semiconductor wafer;
   additionally fabricating a plurality of test patterns on the semiconductor wafer;
   testing each of the active die;
   categorizing each die based on the testing results;
   summarizing the results of the categorization in a wafer map;
   compressing the wafer map to produce a binary code;
   recording the binary code by computer controlled laser scribing of a machine readable binary code within one of the test patterns;
   further recording a plurality of redundant copies of the binary code within a plurality of test patterns which are positioned at different locations on the semiconductor wafer; and
   reading the binary code from the test patterns by means of video and computer equipment.

* * * * *